United States Patent
Song et al.

(10) Patent No.: US 11,488,988 B2
(45) Date of Patent: Nov. 1, 2022

(54) DISPLAY BACKPLANE AND MANUFACTURING METHOD THEREOF, AND DISPLAY PANEL

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 783 days.

(21) Appl. No.: 16/333,997

(22) PCT Filed: Oct. 31, 2018

(86) PCT No.: PCT/CN2018/112898
§ 371 (c)(1),
(2) Date: Mar. 15, 2019

(87) PCT Pub. No.: WO2019/085928
PCT Pub. Date: May 9, 2019

(65) Prior Publication Data
US 2021/0376031 A1    Dec. 2, 2021

(30) Foreign Application Priority Data
Oct. 31, 2017 (CN) .......................... 201711043454.7

(51) Int. Cl.
*H01L 27/12*    (2006.01)
*H01L 27/32*    (2006.01)
(Continued)

(52) U.S. Cl.
CPC ...... *H01L 27/1255* (2013.01); *H01L 27/1259* (2013.01); *H01L 27/3265* (2013.01);
(Continued)

(58) Field of Classification Search
CPC ............ H01L 27/3265; H01L 27/1255; H01L 27/1259; H01L 51/5218; H01L 2251/5315;
(Continued)

(56) References Cited

U.S. PATENT DOCUMENTS 9,698,176 B1 * 7/2017 Kumar ................ H01L 27/1229
2002/0104995 A1 8/2002 Yamazaki et al.
(Continued)

FOREIGN PATENT DOCUMENTS

CN    1602125 A    3/2005
KR    20150033933 A * 4/2015 ....... G02F 1/136286

OTHER PUBLICATIONS

International Search Report in Application No. PCT/CN2018/112898, dated Jan. 14, 2019.

*Primary Examiner* — Eduardo A Rodela
(74) *Attorney, Agent, or Firm* — Syncoda LLC; Feng Ma

(57) ABSTRACT

A display backplane includes a substrate, a thin film transistor over the substrate, and a pixel capacitor assembly over a side of the thin film transistor away from the substrate, and an orthographic projection of the pixel capacitor assembly on the substrate covers at least one portion of an orthographic projection of the thin film transistor on the substrate. The pixel capacitor assembly includes a first electrode, a passivation layer, and a second electrode, sequentially over a side of the thin film transistor away from the substrate, and an orthographic projection of the first electrode on the substrate is overlapped with the orthographic projection of the thin film transistor on the substrate. A display panel including the display backplane can further include an OLED component, arranged over a side of the pixel capacitor assembly away from the substrate.

9 Claims, 12 Drawing Sheets

(51) Int. Cl.
*H01L 51/56* (2006.01)
*H01L 51/52* (2006.01)

(52) U.S. Cl.
CPC .......... *H01L 51/56* (2013.01); *H01L 51/5218* (2013.01); *H01L 2227/323* (2013.01); *H01L 2251/5315* (2013.01); *H01L 2251/5392* (2013.01)

(58) Field of Classification Search
CPC ......... H01L 2251/5392; H01L 27/1225; H01L 27/3225; H01L 27/3248; H01L 27/3258; H01L 27/326; H01L 27/3262; H01L 27/3276; H01L 28/40
See application file for complete search history.

(56) References Cited

U.S. PATENT DOCUMENTS

| | | | |
|---|---|---|---|
| 2006/0226423 A1* | 10/2006 | Yamasaki | ......... G02F 1/136213 |
| | | | 257/59 |
| 2014/0239264 A1 | 8/2014 | Kwak et al. | |
| 2015/0028307 A1* | 1/2015 | Kim | ................... H01L 51/5246 |
| | | | 257/40 |
| 2015/0055051 A1 | 2/2015 | Osawa et al. | |
| 2017/0047390 A1* | 2/2017 | Lee | ....................... G09G 3/3233 |
| 2017/0194402 A1* | 7/2017 | Choi | ................... H01L 27/3276 |
| 2019/0302917 A1* | 10/2019 | Pan | ........................ G06F 3/044 |

* cited by examiner

DISPLAY BACKPLANE AND MANUFACTURING METHOD THEREOF, AND DISPLAY PANEL

CROSS-REFERENCE TO RELATED APPLICATION

The present application claims priority to Chinese Patent Application No. 201711043454.7 filed on Oct. 31, 2017, the disclosure of which is hereby incorporated by reference in its entirety.

TECHNICAL FIELD

The present disclosure relates generally to the field of display technologies, and more specifically to a display backplane and manufacturing method thereof, a display panel and a display device.

BACKGROUND

In existing sub-pixel designs, the thin film transistor (TFT) portion and the pixel capacitor portion are configured on a same plane. As a result, the pixel capacitor portion (Cst) occupies a majority of the area in a sub-pixel unit.

In one illustrating example of a top-gate top-emitting organic light-emitting diode (OLED) display panel, the metal for the conductive active layer and the metal for the source-drain (S/D) electrode are employed respectively as two electrode plates of the pixel capacitor portion, and the inter-layer dielectric layer (ILD) between them is employed as a capacitance dielectric.

As such, because the ILD layer is relatively thick (3000-6000 Å), the pixel capacitor portion is thus relatively small, and in turn, the pixel capacitance can be easily influenced by the TFT parasitic capacitance when data is written. Consequently, in order to ensure the required value of capacitance, the area of the capacitance cannot be reduced, therefore it is not beneficial for the improvement of the definition of the display panel.

In addition, the thickness of the ILD layer directly influences the magnitude of the pixel capacitance. As such, when the thickness of the ILD layer is reduced, the issue of short circuiting may occur at places where the S/D metal plate and the metal wires of gate electrodes cross with each other. As a consequence, the production yield of the display backplane may be influenced.

Therefore, the structural design of the display backplane in existing technologies needs to be improved.

SUMMARY

The purpose of the present disclosure is to solve at least one of the technical problems in the existing display technologies.

The present disclosure is based on following discovery of the inventors.

The inventor found the display backplane may comprise a substrate, a thin film transistor, and a pixel capacitor assembly, which are disposed successively in layers. In addition, the thin film transistor is arranged between the substrate and the pixel capacitor assembly. As such, the pixel capacitor assembly and the thin film transistor are configured at different layers, the parasitic capacitance is thus not increased, whereas the area of the design is reduced, and the aperture ratio of the pixel region is increased. Such a design will be beneficial for improving the definition of the display panel.

Based on this, one purpose of the present disclosure is to provide a display backplane that has a higher pixel region aperture, higher on-state current and higher production yield.

In a first aspect, the present disclosure provides a display backplane. The display backplane comprises a substrate, a thin film transistor over the substrate, and a pixel capacitor assembly over a side of the thin film transistor away from the substrate. The display backplane is configured such that an orthographic projection of the pixel capacitor assembly on the substrate covers at least one portion of an orthographic projection of the thin film transistor on the substrate.

According to some embodiments of the display backplane, the pixel capacitor assembly comprises a first electrode, a passivation layer, and a second electrode, which are sequentially over a side of the thin film transistor away from the substrate, and it is further configured such that an orthographic projection of the first electrode on the substrate is overlapped with the orthographic projection of the thin film transistor on the substrate.

Herein, optionally, the display backplane as described above can further include a first planarization layer, which is between the thin film transistor and the first electrode.

Furthermore, the first electrode and the first planarization layer can have a substantially same shape.

In the display backplane, the thin film transistor can optionally comprise an active layer having a conductive portion and a non-conductive portion, a gate insulating layer, a gate electrode, and an inter-layer dielectric layer, which are sequentially over the substrate. As such, it is further configured such that the orthographic projection of the first electrode on the substrate is overlapped with an orthographic projection of the gate electrode and the non-conductive portion of the active layer on the substrate.

Herein, the thin film transistor can further comprise a source-drain electrode layer over the active layer, and the first electrode and the source-drain electrode layer can be at a substantially same layer.

Furthermore, the source-drain electrode layer can comprise a source electrode, and the second electrode is electrically coupled to the source electrode.

In addition, the display backplane can be further configured such that an orthographic projection of the second electrode on the substrate covers an orthographic projection of the active layer, an orthographic projection of the gate electrode, and an orthographic projection of the source-drain electrode layer on the substrate.

According to some embodiments of the display backplane described above, an orthographic projection of the passivation layer on the substrate covers an orthographic projection of the first planarization layer, an orthographic projection of the source-drain electrode layer, and an orthographic projection of the inter-layer dielectric layer on the substrate, and the second electrode is electrically coupled to the source electrode through a via in the passivation layer.

Furthermore, the pixel capacitor assembly can optionally further include a second planarization layer, which is arranged between the passivation layer and a portion of the second electrode. The portion of the second electrode is outside of a first region of the second electrode whose orthographic projection on the substrate overlaps with an orthographic projection of the first electrode; and is outside of a second region of the second electrode electrically coupled with the source electrode of the source-drain electrode layer.

In the display backplane, the passivation layer can have a thickness of about 2500-3000 Å.

In a second aspect, the present disclosure further provides a display panel, which comprises a display backplane according to any one of the embodiments described above.

According to some embodiments, the display pane further includes an OLED component, which is arranged over a side of the pixel capacitor assembly away from the substrate.

Herein, optionally, the OLED component can be of a top-emitting type, and the second electrode is configured to serve as an anode of the OLED component.

In a third aspect, the present disclosure further provides a method for manufacturing a display backplane.

The method comprises the following steps:

providing a substrate;

forming a thin film transistor over one side of the substrate; and forming a pixel capacitor assembly over a side of the thin film transistor away from the substrate, such that an orthographic projection on the substrate covers at least one portion of an orthographic projection of the thin film transistor on the substrate.

According to some embodiments, between the step of forming a thin film transistor over one side of the substrate and the step of forming a pixel capacitor assembly over a side of the thin film transistor away from the substrate, the method further includes a step of:

forming a first planarization layer over a side of the thin film transistor away from the substrate.

In the method described above, the step of forming a pixel capacitor assembly over a side of the thin film transistor away from the substrate can optionally comprise the following sub-steps:

forming a first electrode over a side of the first planarization layer away from the substrate;

forming a passivation layer over a side of the first electrode away from the substrate; and forming a second electrode over a side of the passivation layer away from the substrate, wherein the second electrode is electrically coupled to a source electrode of the thin film transistor.

Further in the method, the step of forming a thin film transistor over one side of the substrate can optionally comprise a sub-step of:

forming a source-drain electrode layer over the substrate;

Herein, the above mentioned sub-step of forming a source-drain electrode layer over the substrate and the sub-step of forming a first electrode over a side of the first planarization layer away from the substrate can optionally be performed at a substantially same step.

According to some embodiments of the method described above, after the sub-step of forming a passivation layer over a side of the first electrode away from the substrate and prior to the sub-step of forming a second electrode over a side of the passivation layer away from the substrate, the step of forming a pixel capacitor assembly over a side of the thin film transistor away from the substrate further comprises a sub-step of:

forming a second planarization layer over a side of the passivation layer away from the substrate, wherein the second planarization layer is arranged at a region whose orthographic projection on the substrate does not overlap with an orthographic projection of the first electrode, wherein the region is further outside an electrical coupling region between the second electrode and the source electrode.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

In a first aspect, the present disclosure provides a display backplane.

With reference to FIGS. 1-4, 6-9, 11-14, 16-18, several embodiments of the display backplane disclosed herein will be described in the following in detail. It should be noted that the structural views of the display backplane as illustrated in FIGS. 1-3, 7, 9, 12, 14 and 17 are cross-sectional views along a direction from the source electrode (S) to drain electrode (D) of the driving thin-film transistor (TFT). In the top views of the display backplane shown in FIGS. 6, 8, 11, 13, 16 and 18, the substrate, each dielectric layer (including a buffering layer, a gate insulating layer, an inter-layer dielectric layer, a planarization layer, and a passivation layer, etc.) and the source-drain electrode layer are skipped in each of these figures.

Figure 1:
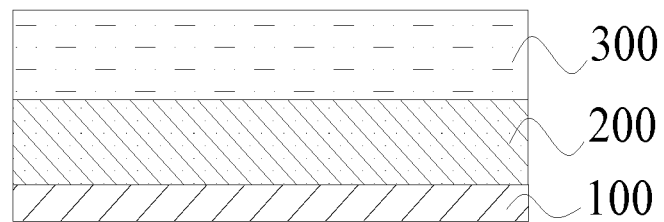
FIG. 1 is a cross-sectional view of the structure of a display backplane according to some embodiments of the present disclosure.

FIG. 1 is a cross-sectional view of the structure of a display backplane according to some embodiments of the present disclosure. As shown in FIG. 1, the display backplane includes a substrate 100, a thin film transistor (TFT) 200, and a pixel capacitor assembly 300, stacked over one another. The thin film transistor 200 is arranged over the substrate 100. The pixel capacitor assembly 300 is arranged over the thin film transistor 200, and more specifically is arranged over a side of the thin film transistor 200 that is far away from (i.e. distal to) the substrate 100. It is further configured such that an orthographic projection of the pixel capacitor assembly 300 on the substrate 100 covers at least a portion of an orthographic projection of the thin film transistor 200 on the substrate 100.

As such, in the display backplane having the configuration described above, the pixel capacitor assembly 300 and the thin film transistor 200 are arranged at different layers. The stacked pixel capacitor assembly and the TFT can reduce the design area and improve the aperture ratio of sub-pixel units without increasing the parasitic capacitance.

According to some embodiments of the present disclosure, the thin film transistor comprises an active layer, a gate electrode, and a source-drain electrode layer. It is configured such that the orthographic projection of the pixel capacitor assembly on the substrate covers at least a portion of an orthographic projection of the active layer, the gate electrode, or the source-drain electrode layer on the substrate. For example, the orthographic projection of the pixel capacitor assembly on the substrate covers at least a portion of the orthographic projection of the active layer; the orthographic projection of the pixel capacitor assembly on the substrate covers at least a portion of the orthographic projection of the gate electrode; the orthographic projection of the pixel capacitor assembly on the substrate covers at least a portion of the orthographic projection of the source-drain electrode layer on the substrate; the orthographic projection of the pixel capacitor assembly on the substrate covers an orthographic projection of the active layer and the gate electrode; the orthographic projection of the pixel capacitor assembly on the substrate covers an orthographic projection of the active layer, the gate electrode, and the source-drain electrode layer on the substrate.

Figure 2:
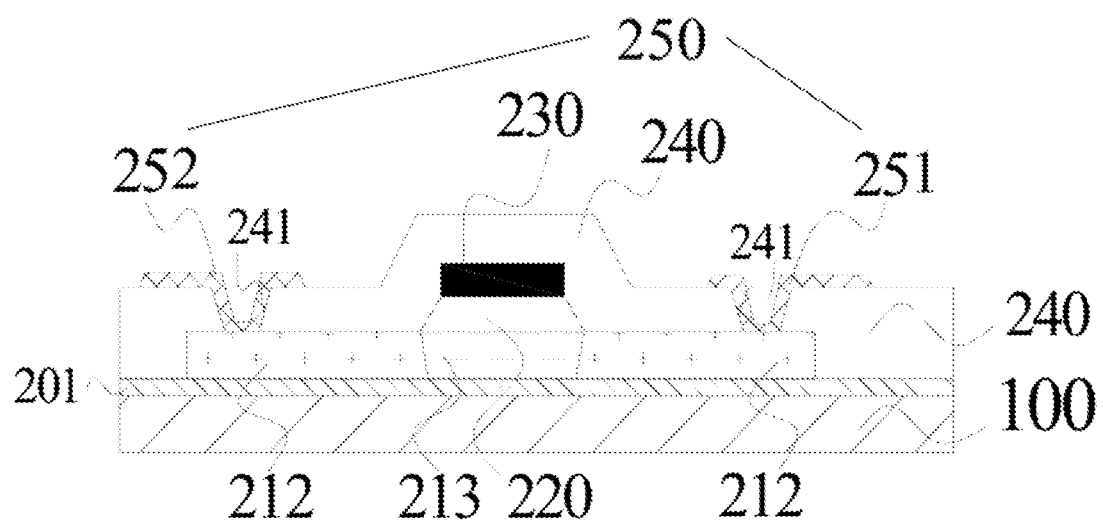
FIG. 2 is a cross-sectional view illustrating a more detailed structure of the thin film transistor in the display backplane shown in FIG. 1 according to some embodiments of the present disclosure.

FIG. 2 is a cross-sectional view illustrating a more detailed structure of the thin film transistor in the display backplane shown in FIG. 1 according to some embodiments of the present disclosure. As shown in FIG. 2, the thin film transistor 200 is of a top-gate structure, and the thin film transistor 200 includes a buffering layer 201, an active layer comprising a non-conductive portion 213 and a conductive portion 212, a gate insulating layer 220, a gate electrode 230, an inter-layer dielectric layer 240, and a source-drain electrode layer 250 (including a source electrode 251 and a drain electrode 252). The buffering layer 201 is disposed over the substrate 100. The non-conductive portion 213 and the conductive portion 212 of the active layer are arranged over a side of the buffering layer 201 that is far away from the substrate 100.

The gate insulating layer 220 is arranged over a side of the non-conductive portion 213 of the active layer that is far away from the substrate 100. The gate electrode 230 is arranged over a side the gate insulating layer 220 that is far away from the substrate 100. The inter-layer dielectric layer 240 is arranged to cover the gate electrode 230 and the conductive portion of 212 of the active layer. The source-drain electrode layer 250 is arranged over a side of the inter-layer dielectric layer 240 that is far away from the substrate 100, and is further configured to be in contact with the conductive portion 212 of the active layer through first via (s) 241.

Figure 3:
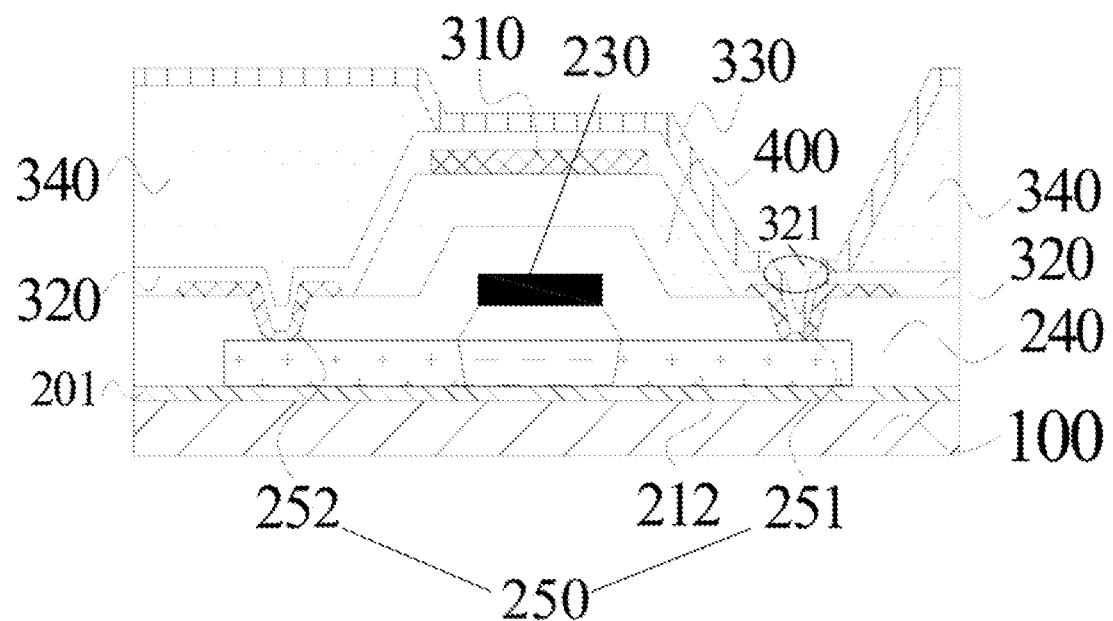
FIG. 3 is a cross-sectional view illustrating a more detailed structure of the pixel capacitor assembly in the display backplane shown in FIG. 1 according to some embodiments of the present disclosure.

FIG. 3 is a cross-sectional view illustrating a more detailed structure of the pixel capacitor assembly in the display backplane shown in FIG. 1 according to some embodiments of the present disclosure. As shown in FIG. 3, the pixel capacitor assembly 300 comprises a first electrode 310, a passivation layer 320, and a second electrode 330. The first electrode 310 is arranged at a side of the pixel capacitor assembly 300 that is close to the substrate 100. The passivation layer 320 is arranged over a side of the first electrode 310 that is far away from the substrate 100. The second electrode 330 is arranged over a side of the passivation layer 320 that is far away from the substrate 100.

By the configuration as described above, the pixel capacitor assembly 300 substantially takes a stacked structure, where the first electrode 310 and second electrode 330 utilizes the passivation layer 320 as a capacitance dielectric layer. As such, there is no need to utilize the conductive portion 212 of the active layer as the electrode plate of the pixel capacitor assembly, and the distance of a current running through a lightly-doped drain structure (LDD) region such as the conductive portion of 212 can be reduced. Thereby, it is beneficial for the improvement of the on-state current.

In addition, there is no need to utilize the inter-layer dielectric layer (ILD) 240 as the capacitance dielectric, which can thereby adopt a suitable thickness to ensure a suitable and enough insulation between the source-drain electrode layer and the gate electrode. Thereby, the production yield of the display backplane can also be improved.

In some embodiments of the present disclosure, the display backplane further comprises a first planarization layer 400, which is arranged between the thin film transistor 200 and the first electrode 310. As such, the first planarization layer 400 can provide a flattened surface for forming the first electrode 310 so that the smoothness of the pixel capacitor assembly 300 is not influenced by the uneven surface of TFT 200.

In the embodiments as shown in FIG. 3, the first planarization layer 400 can be arranged over a side of the inter-layer dielectric layer 240 that is far away from the gate electrode 230. As such, the first planarization layer 400 not only can provide a flattened surface for the first electrode 310, but also can increase a distance of the first electrode 310 to the thin film transistor 200 disposed therebelow so that the interference of the first electrode 310 to the thin film transistor 200 can be at least partially eliminated.

In some embodiments of the display backplane disclosed herein, the first electrode 310 of the pixel capacitor assembly 300 and the source-drain electrode layer 250 of the thin film transistor 200 are arranged at a substantially same layer. In some embodiments, the first electrode 310 and the source-drain electrode layer 250 are formed by one pattern process and the same material. The first electrode 310 and the source-drain electrode layer 250 are formed conformally on the layer below. There is no need for the first electrode 310 and the source-drain electrode layer 250 are on a same plane or same distance from the substrate. As such, the thickness of the display backplane can be reduced, and the first electrode 310 can be at an electric potential (or electrical level) of $V_G$, thereby the first electrode 310 can form a pixel capacitance with the second electrode 330. $V_G$ represents a gate terminal of a driving TFT of OLED.

In some embodiments, it is further configured that an orthographic projection of the first electrode 310 on the substrate 100 covers at least a portion of an orthographic projections of the active layer (i.e. the non-conductive portion 213 and the conductive portion 212 of the active layer) and the gate electrode 230 on the substrate 100.

Figure 8:
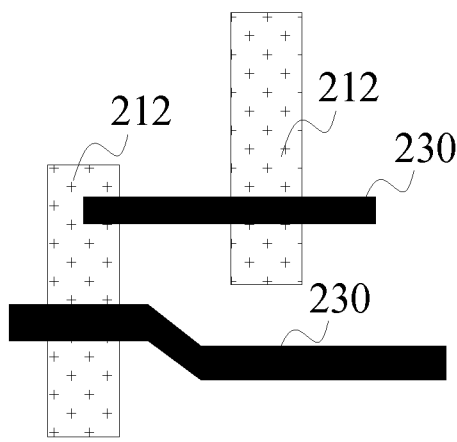
FIG. 8 is a top view of the intermediate product after the sub-step S208 of the step S200 of the manufacturing method of an embodiment of the present disclosure.
Figure 16:
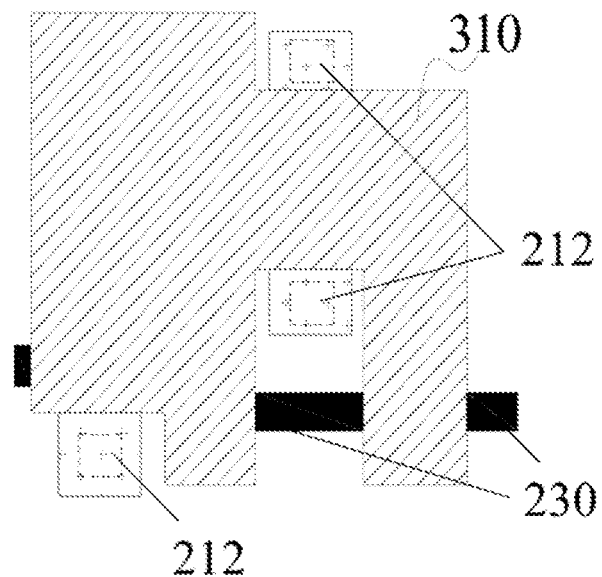
FIG. 16 is a top view of the product of step S310 of the manufacturing method of an embodiment of the present disclosure.

In some embodiments, the shape of the cross-section of the first electrode 310 is illustrated in FIG. 16. FIG. 8 shows a top view of the double-TFT structure comprising a switching TFT and a driving TFT. Each of the switching TFT and the driving TFT includes an active layer, and a gate electrode 230 over the active layer. In this top view of the structure in FIG. 8, the conductive portion 212 of the active layer in each of the switching TFT and the driving TFT is also shown in the figure. It is noted that the non-conductive portion 213 of the active layer in each of the switching TFT and the driving TFT is not shown.

FIG. 16 substantially adds the first electrode 310 on the double-TFT structure shown in FIG. 8. As shown in FIG. 16, the orthographic projection of the first electrode 310 on the substrate 100 covers a portion of the orthographic projections of the conductive portion 212 of the active layer and the gate electrode 230 on the substrate 100. As a result, the stacked space at a side of the thin film transistor 200 that is far away from the substrate 100 is adequately utilized, meanwhile, the original wiring of the source-drain electrode layer 250 is not influenced.

Herein, there are no specific limitations to the thickness of the first electrode 310, and persons skilled in the art can adjust the thickness of it according to the specific material of the first electrode 310.

According to some embodiments of the disclosure, the first electrode 310 and the source-drain electrode layer 250 are formed through a same one-time patterning process, and thereby the material for, and the thickness of the first electrode 310 and the source-drain electrode layer 250 are substantially same. As such, when forming the source-drain electrode layer 250 of the thin-film transistor 200, the first electrode 310 of the pixel capacitor assembly 300 can also be formed at the same time over a surface of the first planarization layer 400.

Herein, there are no specific limitations to the shape of the cross-section of the first planarization layer 400. In some embodiments, with reference to FIG. 11, the shape of the cross-section of the first planarization layer 400 and the shape of the cross-section of the first electrode 310 are substantially same. Consequently, the first electrode 310 formed onto the first planarization layer 400 can be completely flat, thus the area occupied by the pixel capacitor assembly 300 can be further reduced. Herein, the thickness of the first planarization layer 400, which can be adjusted based on the specific thickness of the inter-layer dielectric layer 240. Details of these above features will not be repeated herein.

There are no specific limitations to the shape of the passivation layer 320 in the pixel capacitor assembly 300, as long as the passivation layer 320 of a certain shape can ensure the area of the capacitance dielectric between the first electrode 310 and the second electrode 330, persons skilled in the art can design the shape of the passivation layer 320 according to the practical applications of the display backplane.

In some embodiments, with reference to FIG. 3, the passivation layer 320 is configured to be further extended to thereby cover the first planarization layer 400, the source-drain electrode layer 250, and the inter-layer dielectric layer 240. Such a configuration allows that each of the above layers of the TFT (except the source electrode 251 in the source-drain electrode layer 250 as illustrated in FIG. 3) can be sufficiently insulated from the second electrode 330.

In some embodiments, with reference to FIG. 3, a third via 321 (as shown by the enclosed part by the oval with dotted line) can be further formed within or inside the passivation layer 320, such as at a location of the passivation layer 320 corresponding to where one of the first via 241 is arranged. The third via 321 is configured to electrically connect the second electrode 330 and one electrode of the source-drain electrode 250.

Herein there are no limitations to the thickness of the passivation layer 320, as long as the passivation layer 320 of a certain thickness can function as a capacitance dielectric of the pixel capacitor assembly 300, and persons skilled in the art can design and adjust the thickness thereof according to the practical requirements of the pixel capacitor assembly 300. According to some embodiments, the thickness of the passivation layer 320 is around 2500-3000 Å. As such, compared with the existing inter-layer dielectric layer 240 (the thickness is 3000~6000 Å), the passivation layer 320 in some embodiments of the present disclosure is thinner, therefore the capacitance area of the pixel capacitor assembly 300 at most can be reduced to 50%.

In some embodiments, with further reference to FIG. 3, the second electrode 330 and the source electrode 251 in the source-drain electrode layer 250 are electrically connected to each other. As such, the second electrode 330 of the pixel capacitor assembly 300 is coupled to the source electrode 251 and thus can be configured to be at an electric potential of Vs. $V_s$ represents a source terminal of a driving TFT of OLED. According to some embodiments shown in FIG. 3, the second electrode 330 and the source electrode 251 are in direct contact with each other through the third via 321 as described above to thereby get electrically connected to each other.

Herein, there are no limitations to the shape of the second electrode 330, as long as the second electrode 330 of a certain shape can ensure the alignment area of the first electrode 310 and the second electrode 330 satisfy the design requirements of the pixel capacitor assembly 300, and persons skilled in the art can design the shape thereof according to the requirements of the pixel capacitor assembly 300.

Figure 18:
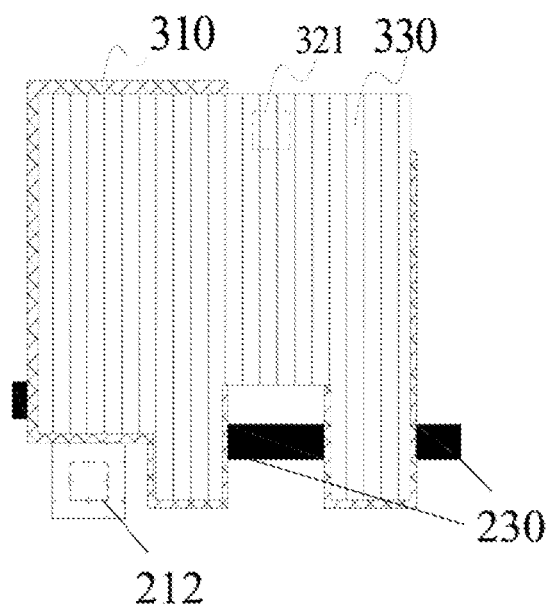
FIG. 18 is a top view of the product of step 330 of the manufacturing method of an embodiment of the present disclosure.

According to some embodiments, the shape of the second electrode 330 is illustrated in FIG. 18. FIG. 18 is substantially a top view of a structure adding the second electrode 330 over the double-TFT structure shown in FIG. 16. Because the orthographic projection of the second electrode 330 on the substrate 100 is configured to cover at least a portion of the orthographic projections of the first electrode 310 on the substrate 100, thus in the top view shown in FIG. 18, only a margin of the first electrode 310 is shown, and other portions of the first electrode 310 is actually hidden below the second electrode 330.

It is noted that between the first electrode 310 and the second electrode 330, there is actually a planarization layer (i.e. the second planarization layer 340 in FIG. 3 and described below), which is also hidden below the second electrode 330 in the top view shown in FIG. 18. As a result, the stacked space at a side of the thin film transistor 200 that is far away from the substrate 100 is adequately utilized, meanwhile, the original wiring of the source-drain electrode layer 250 is not influenced.

Figure 4:
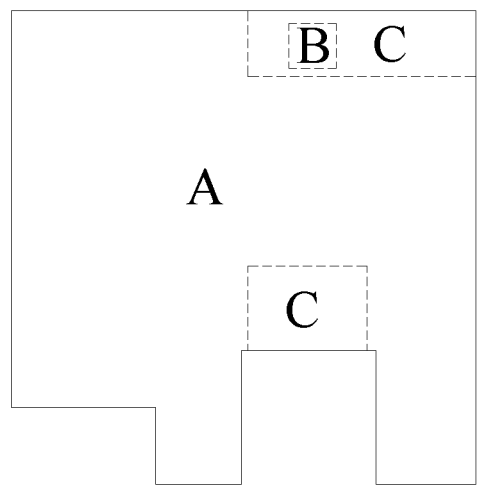
FIG. 4 is a schematic diagram of different portions of the second electrode in the pixel capacitor assembly of the display backplane according to some embodiments of the present disclosure.

In some embodiments of the display backplane as illustrated in FIG. 4, the second electrode 330 of the pixel capacitor assembly 300 comprises three portions: a first portion, a second portion, and a third portion, which are respectively in a first region (i.e. region A), a second region (i.e. region B), and a third region (i.e. region C). The first region (i.e. region A) is the region of the second electrode 330 whose orthographic projection on the substrate 100 completes matches with the orthographic projection of the first electrode 310 on the substrate 100 (i.e. the orthographic projection of the first region on the substrate 100 corresponds to the overlapped region between the orthographic projections of the second electrode 330 and the first electrode 310 on the substrate 100). The second portion of the second electrode 330 (i.e. the portion of the second electrode 330 within the second region) is configured to be in contact with the source electrode 251. The third region (i.e. region C) of the second electrode 330 is the region of the second electrode 330 except the first region (i.e. region A) and the second region (i.e. region B).

With further reference to FIG. 3, the pixel capacitor assembly 300 can further comprise a second planarization layer 340. The second planarization layer 340 can be arranged between the passivation layer 320 and the third portion of the second electrode 330 (i.e. the portion of the second electrode 330 corresponding to the region C shown in FIG. 4). By the configuration described above, the second planarization layer 340 is configured to increase the distance of the third portion of the second electrode 330, such that the charged second electrode 330 will not influence the thin film transistor 200.

There are no limitations to the specific material of the gate insulating layer 220, the inter-layer dielectric layer 240, and the passivation layer 320. For example, it can be $SiO_x$, $SiN_x$, $SiO_xN_y$, an organic insulating material, $AlO_x$, $HfO_x$ or $TaO_x$ and so on. Persons skilled in the art can select the material according to requirements of the display backplane, and it will not be repeated herein.

There are no limitations to the material of the first planarization layer 400 and the second planarization layer 340, which includes, but not limited to, a planarization material (e.g. a polysiloxane-based material, an acrylic-based material, and a polyimide-based material), a color film material, or a material for pixel define layer, and so on. Persons skilled in the art may select the material for the first planarization layer 400 and/or the second planarization layer 340 accordingly based on the specific requirements of the display backplane, and it will not be repeated herein.

According to some embodiments of the display backplane, the display backplane further comprises an OLED component, and thus the display backplane is an OLED display backplane. In some embodiments, the OLED component is arranged over a side of the pixel capacitor assembly 300 that is far away from the substrate 100.

In some embodiments of the OLED display backplane, the OLED component is of a top-emitting type, and the second electrode 330 is also employed as an anode of the OLED component. As such, the passivation layer 320 can replace the inter-layer dielectric layer 240 in existing OLED technologies as the dielectric layer of the pixel capacitor assembly 300. Additionally, the passivation layer can be made thinner than the inter-layer dielectric layer 240. As such, the pixel capacitance can be effectively increased, and the problem that the production yield is negatively influenced when the inter-layer dielectric layer 240 is too thin in existing technologies can also be effectively solved.

In some other embodiments of the OLED display backplane, the OLED component is of a bottom-emitting type. Accordingly, the pixel capacitor assembly 300 having a stacked configuration as described above can shield the TFT 200 from lights. As a result, the stability of the light of the display panel can be increased, reducing the difficulties in compensation.

There are no limitations to the material of each electrode (including the gate electrode 230, the source-drain electrode layer 250, the first electrode 310, and the second electrode 330). Specifically, examples of an electrode material can be a common metal material such as Ag, Cu, Al, Mo, a multilayer metal material such as Mo/Cu/Mo, a metal alloy material such as AlNd, MoNb, a stacked structure formed by metals and transparent conductive oxides such as ITO/Ag/ITO, and so on. Persons skilled in the art can select the electrode material according to the specific type of the display backplane.

Furthermore, for a top-emitting OLED display backplane in particular, the second electrode 330 can at the same time be employed as an anode of the OLED component, and thus the material for the second electrode 330 can be the ITO/Ag/ITO stacked structure. As such, the anode that has a reflecting function can reflect the light emitted by the light-emitting layer of the OLED component towards the top of the display backplane, thereby the light-emitting efficiency of the OLED component can be improved.

There are no limitations to the material of the active layer comprising the conductive portion 212 and the non-conductive portion 213, as long as the material can be equally applicable in the oxide technology, the silicon technology and the organic material technology in a display backplane. Persons skilled in the art can select the material according to the specific type of the display backplane.

For a top-emitting display backplane in particular, the material of the active layer can be selected from an oxide (e.g. a-IGZO, ZnON, or IZTO, etc.), a silicon material (e.g. a-Si or p-Si, etc.) and an organic material (e.g. sexithiophene or polythiophene, etc.).

In summary, embodiments of the present disclosure provide a display backplane, which comprises a substrate, a thin film transistor and a pixel capacitor assembly, stacked successively in layers. The thin film transistor is arranged between the substrate and the pixel capacitor assembly. Thereby, the pixel capacitor assembly and the thin film transistor are arranged at different layers in the display backplane without increasing the parasitic capacitance, additionally reducing the design area and improving the aperture ratios of the pixel region. Therefore, it is beneficial for the improvement of the definition of the display panel.

In addition, because the pixel capacitor assembly in the display backplane disclosed herein is stacked in layers, there is no need to employ a conductive region of an active layer of the thin film transistor as the capacitance plate, and the distance of a current running through a lightly-doped drain structure (LDD) region can be reduced. Thereby, the on-state current can be improved.

In a second aspect, the present disclosure further provides a display panel, which includes a display backplane according to any one of the embodiments as described above.

The display panel herein may be an organic light-emitting diode (OLED) display panel, and thus can further comprise an OLED component. The OLED component can be arranged over a side of the pixel capacitor assembly away from the substrate.

Optionally, the OLED component described above is of a top-emitting type, and the second electrode in the display backplane is configured to serve as an anode of the OLED component.

In a third aspect, the present disclosure further provides a manufacturing method of a display backplane. With reference to FIGS. 3-18, the method will be described in detail.

Figure 5A:
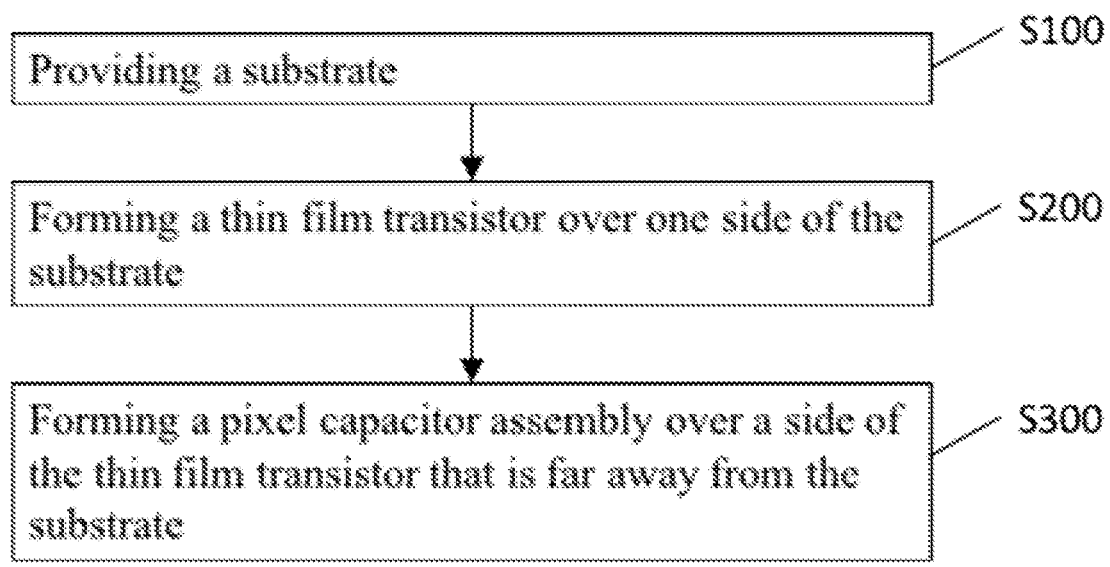
FIG. 5A is a flow chart of a method for manufacturing a display backplane according to some embodiments of the present disclosure.

According to embodiments of the present disclosure shown in FIG. 5A, the manufacturing method comprises:

S100: Providing a substrate.

By means of this step of the manufacturing method, the substrate 100 is prepared to thereby allow the subsequent formation of the thin film transistor 200 and the pixel capacitor assembly 300 thereupon.

According to embodiments of the present disclosure, a surface treatment may also be conducted on a side of the substrate 100, and the side will be configured for formation of the thin film transistor 200 and the pixel capacitor assembly 300 thereupon. Herein, there are no limitations to the specific surface treatment approach.

S200: Forming a thin film transistor over one side of the substrate.

By means of this step of the manufacturing method, the thin film transistor 200 can be formed over one side of the substrate 100. In some embodiments, the thin film transistor may comprise an active layer comprising a conductive portion 212 and a non-conductive portion 213, a gate electrode 230 and a source-drain electrode layer 250. Herein, there are no limitations to the specific approach of forming the thin film transistor 200.

S300: Forming a pixel capacitor assembly over a side of the thin film transistor that is far away from the substrate.

By means of this step of the manufacturing method, the pixel capacitor assembly 300 can be formed over the side of the thin film transistor 200 that is far away from the substrate. Thereby, a display backplane can be formed, in which the pixel capacitor assembly 300 and the thin film transistor 200 are at different layers. The parasitic capacitance is not increased, the design area can be saved, and the aperture ratio of sub-pixel units can be improved.

Figure 5B:
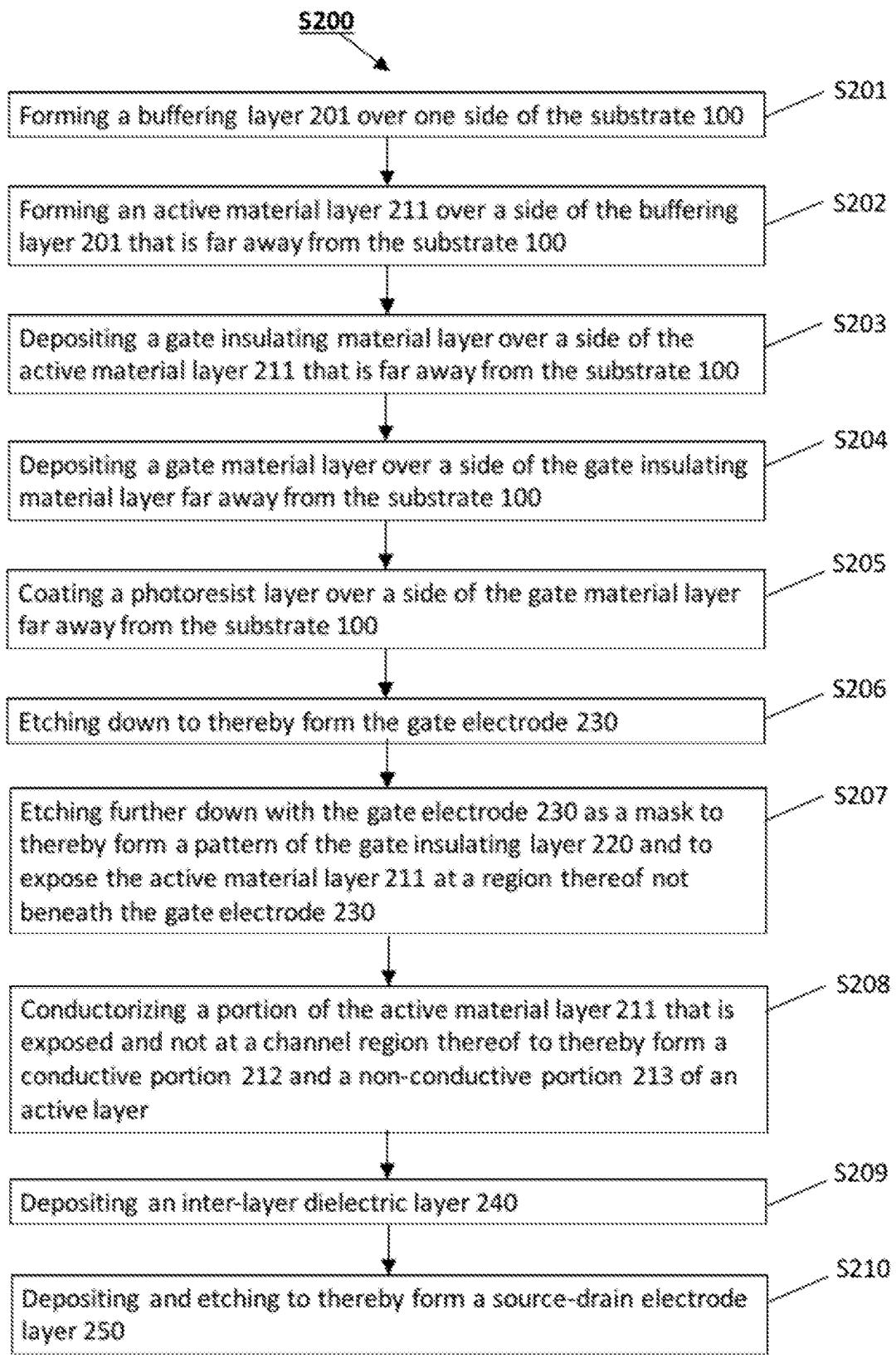
FIG. 5B is a flow chart illustrating the sub-steps for forming a thin-film transistor in the method for manufacturing a display backplane according to some embodiments of the present disclosure.

According to some embodiments of the disclosure, the thin film transistor is of a top-gate type. As such, the step S200 comprises the following sub-steps, as illustrated in FIG. 5B:

S201: Forming a buffering layer 201 over one side of the substrate 100;

S202: Forming an active material layer 211 over a side of the buffering layer 201 that is far away from the substrate 100.

Figure 6:
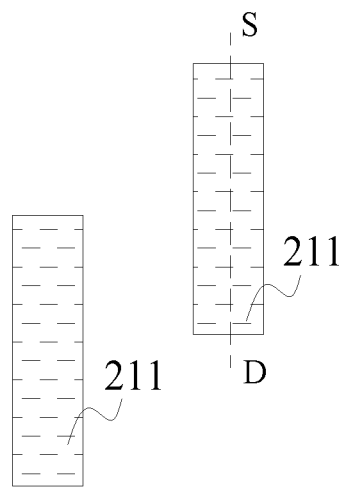
FIG. 6 is a top view of the intermediate product after the sub-step S202 of the step S200 of the manufacturing method of an embodiment of the present disclosure.
Figure 7:
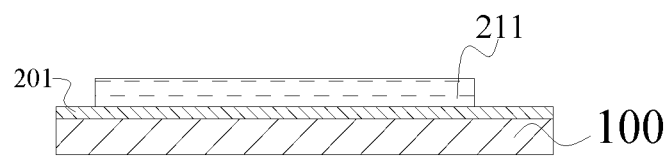
FIG. 7 is a cross-sectional view of the intermediate product after the sub-step S202 of the step S200 of the manufacturing method of an embodiment of the present disclosure.

The structure of the intermediate product obtained after this sub-step S202 is illustrated in FIG. 6 and FIG. 7. FIG. 7 is a cross-sectional view of the active material layer 211 at a location corresponding to the driving TFT along the SD line. It is noted that in FIG. 6, the substrate 100 and each dielectric layer are omitted.

S203: Depositing a gate insulating material layer over a side of the active material layer 211 that is far away from the substrate 100;

S204: Depositing a gate material layer over a side of the gate insulating material layer far away from the substrate 100;

S205: Coating a photoresist layer over a side of the gate material layer far away from the substrate 100;

S206: Etching down to thereby form the gate electrode 230;

S207: Etching further down with the gate electrode 230 as a mask to thereby form a pattern of the gate insulating layer 220 and to expose the active material layer 211 at a region thereof not beneath the gate electrode 230 (i.e. the region not in the channel region);

S208: Conductorizing a portion of the active material layer 211 that is exposed and not at a channel region thereof to thereby form a conductive portion 212 and a non-conductive portion 213 of an active layer.

Herein, the sub-step S208 can be performed through doping conductive ions or metal elements at said portion of the active material layer 211.

Figure 9:
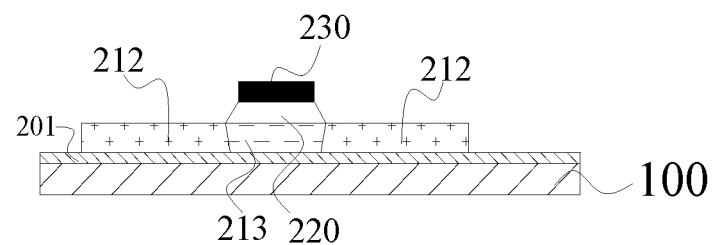
FIG. 9 is a cross-sectional view of the intermediate product after the sub-step S208 of the step S200 of the manufacturing method of an embodiment of the present disclosure.

The structure of the intermediate product obtained after the sub-step S208 is illustrated in FIG. 8 and FIG. 9.

S209: Depositing an inter-layer dielectric layer 240;

S210: Depositing and etching to thereby form a source-drain electrode layer 250.

As such, the thin film transistor 200 of a top-gate type can be formed in the display backplane.

Figure 10:
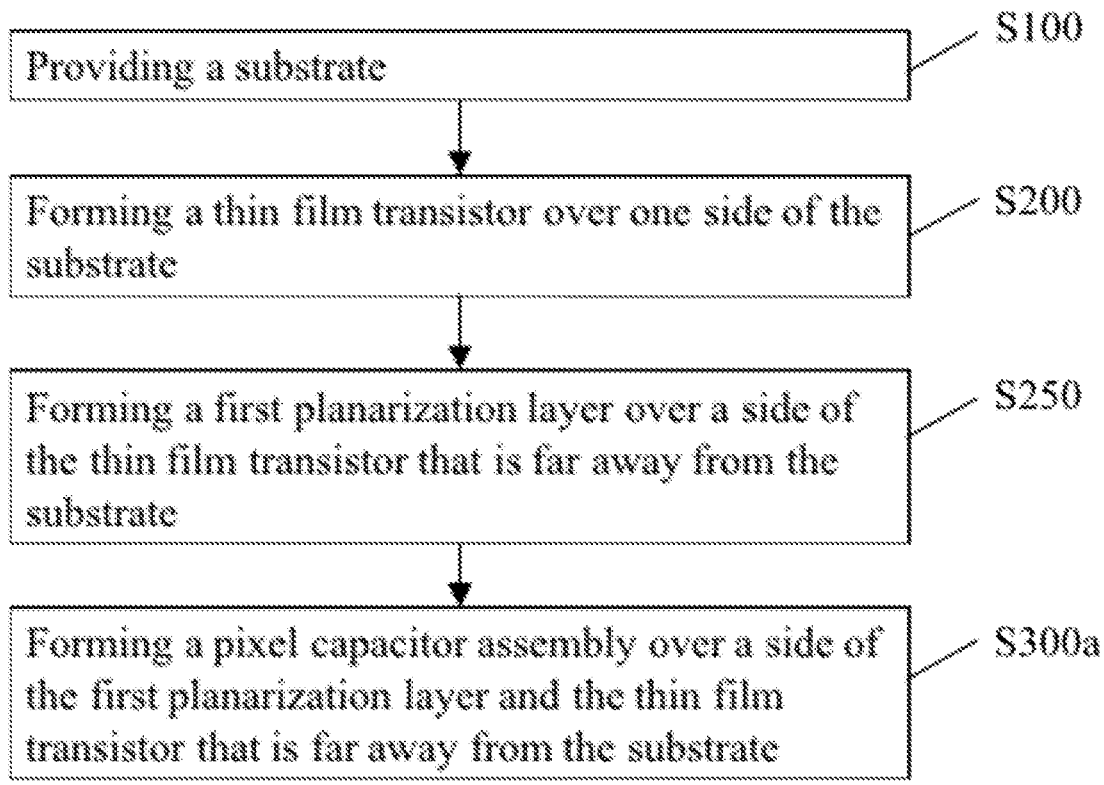
FIG. 10 is a flow chart of a method for manufacturing a display backplane according to some other embodiments of the present disclosure.

According to some other embodiment, with reference to FIG. 10, after the step S200 and before the step S300, the manufacturing method may further comprise:

S250: Forming a first planarization layer over a side of the thin film transistor that is far away from the substrate.

Accordingly, in these embodiments of the manufacturing method, the step S300 specifically comprises:

S300a: Forming a pixel capacitor assembly over a side of the first planarization layer and the thin film transistor that is far away from the substrate.

By means of the step S250 according to some embodiments of the manufacturing method disclosed herein, the first planarization layer 400 can be formed over a side of the thin film transistor 200 already formed that is far away from the substrate 100, which is configured to provide a flattened surface for forming the first electrode 310 thereupon during the subsequent step S300a of forming the pixel capacitor assembly.

According to some embodiments of the method, the first planarization layer 400 is formed over a side of the inter-layer dielectric layer 240 that is far away from the gate electrode 230, and it is configured such that an orthographic projection of the first planarization layer 400 on the substrate 100 covers a portion of an orthographic projections of the active layers 212 and 213 and the gate electrode 230 on the substrate 100.

Figure 11:
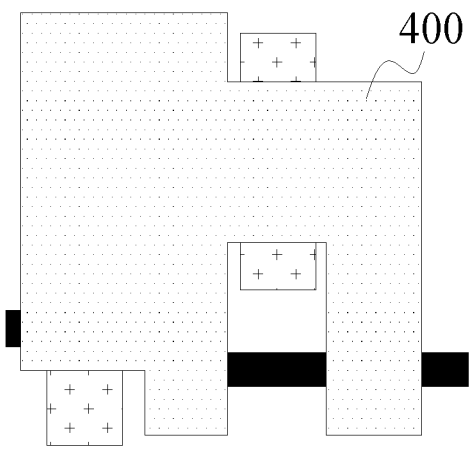
FIG. 11 is a top view of the intermediate product after the step S250 of the manufacturing method according to some embodiments of the present disclosure.
Figure 12:
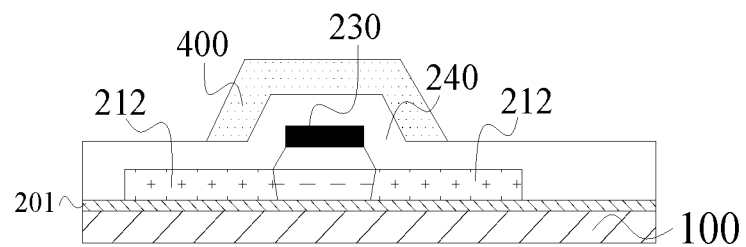
FIG. 12 is cross-sectional view of the intermediate product after the step S250 of the manufacturing method according to some embodiments of the present disclosure.

Thereby, the first planarization layer 400 does not cover metal wire regions corresponding to the source electrode, the drain electrode, or cover regions corresponding to the via. In addition to provide a flattened surface for the formation of the first electrode 310, the first planarization layer 400 can also increase the thickness of the first electrode 310, so that the interference of the first electrode 310 with the thin film transistor 200 can be avoided. The structure of the intermediate product obtained after this step is illustrated in FIG. 11 and FIG. 12.

Herein, the step S250 can be carried out by depositing and patterning. Herein, there are no limitations to the specific approaches of forming the first planarization layer 200.

According to some embodiments, after the step S250, the method further includes a step S260:

S260: Forming vias through the inter-layer dielectric layer 240 and the first planarization layer 400.

Herein, the vias can include a first via 241 that only penetrates the inter-layer dielectric layer 230, and a second via 242 that penetrates both the inter-layer dielectric layer 240 and the first planarization layer 400. The first via 241 and the second via 242 formed thereby can be employed for the electrical connection of the electrodes.

Figure 13:
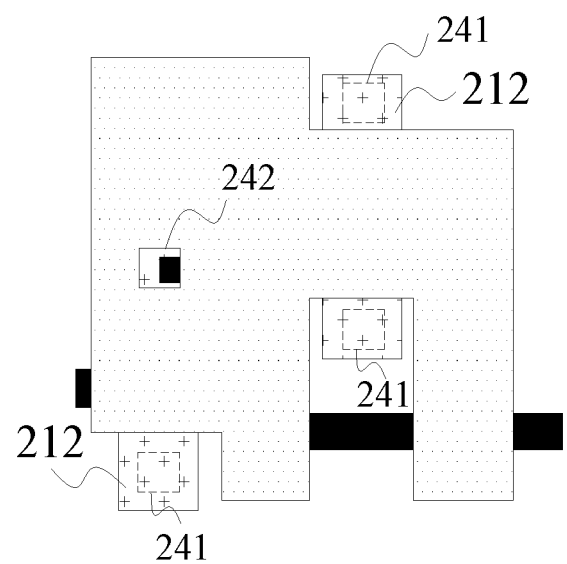
FIG. 13 is a top view of the product after the step S250 of the manufacturing method according to some other embodiments of the present disclosure.
Figure 14:
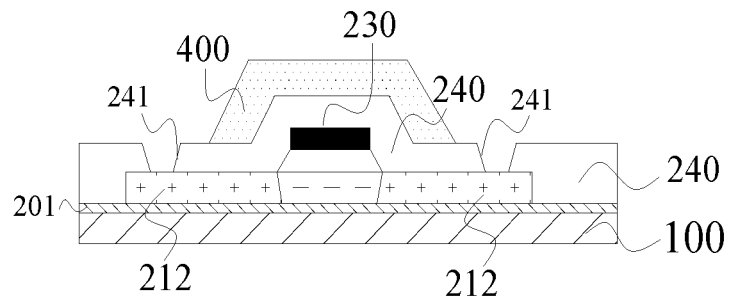
FIG. 14 is cross-sectional view of the product after the step S250 of the manufacturing method according to some other embodiment of the present disclosure.

The structure of the product obtained through this step can refer to FIG. 13 and FIG. 14.

By means of this step S300 or S300a of the manufacturing method, the pixel capacitor assembly 300 can be formed over the side of the thin film transistor 200 and the first planarization layer 400 that is far away from the substrate. Consequently, the stacked pixel capacitor assembly 300 and thin film transistor 200 can be formed. The parasitic capacitance is not increased, the design area can be saved, and the aperture ratio of the sub-pixel unit can be improved.

In some embodiments of the present disclosure, the orthographic projection of the pixel capacitor assembly 300 over the substrate 100 covers a portion of the orthographic projection of the active layer 212 and 213, the gate electrode 230 and the source-drain electrode 250 over the substrate 100.

Figure 15A:
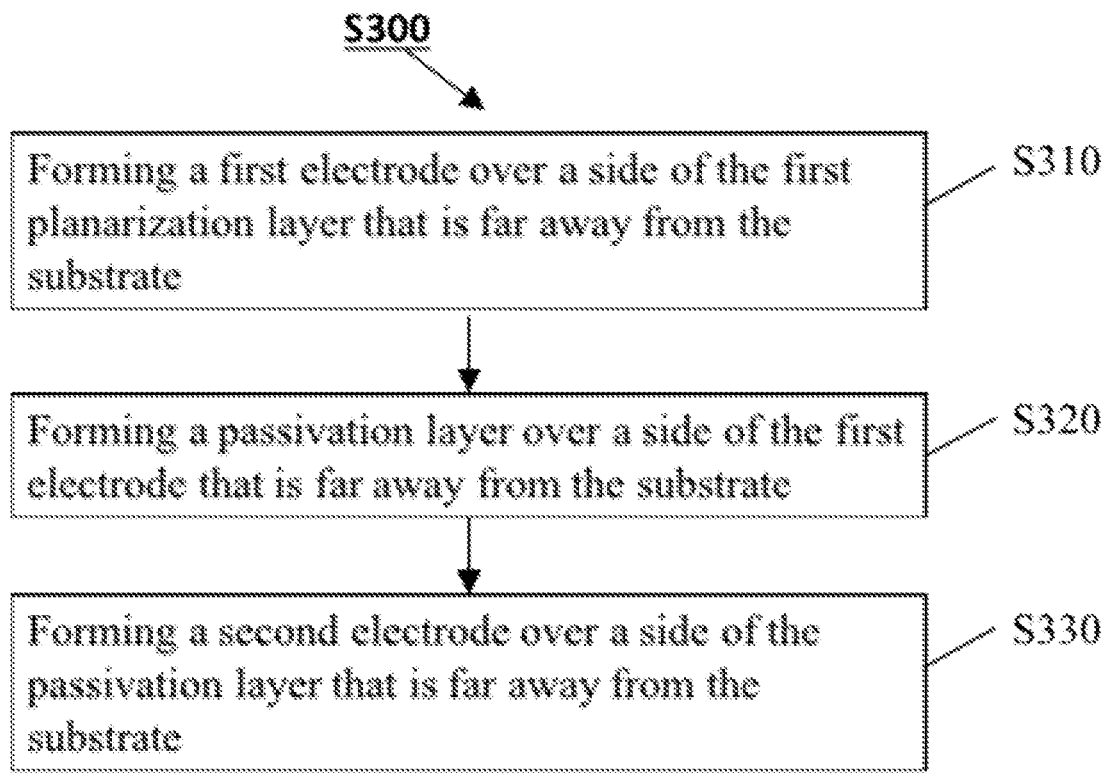
FIG. 15A is a flowchart of step S300 of the manufacturing method according to some embodiments of the present disclosure.

According to embodiments of the present disclosure, with reference to FIG. 15A, step S300 may further comprise the following sub-steps:

S310: Forming a first electrode over a side of the first planarization layer that is far away from the substrate.

By means of this sub-step in the method, the first electrode 310 can be formed over the side of the planarization layer 400 that is far away from the substrate 100. Consequently, the first electrode 310 formed over the upper surface of the first planarization layer 400 can be more flattened, and because of the raising up by the first planarization layer 400, the influence of the first electrode 310 to the thin film transistor 200 can be further avoided.

According to some embodiments, the shape of the first electrode 310 formed thereby can be substantially same as the shape of the first planarization layer 400, and the orthographic projection of the first electrode 310 on the substrate 100 covers a portion of the orthographic projections of the active layer 212 and 213 and the gate electrode 230 on the substrate 100. Consequently, it can be ensured that the first electrode 310 is completely flat, thus it is beneficial for reducing the area that the pixel capacitor assembly 300 occupies.

Figure 17:
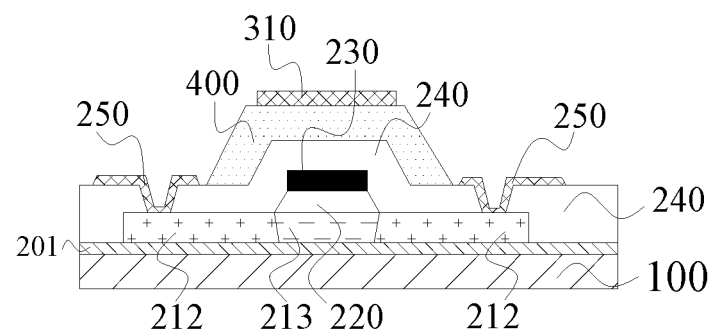
FIG. 17 is cross-sectional view of the product of step S310 of the manufacturing method of an embodiment of the present disclosure.

The structure of the intermediate product obtained after this sub-step is illustrated in FIG. 16 and FIG. 17.

S320: Forming a passivation layer over a side of the first electrode that is far away from the substrate.

By means of this sub-step of the method, the passivation layer 320 can be formed over the side of the first electrode 310 that is far away from the substrate 100. Thereby the dielectric layer of the pixel capacitor assembly can be obtained.

S330: Forming a second electrode over a side of the passivation layer that is far away from the substrate.

By means of this sub-step of the method, the second electrode 330 can be formed over the side of the passivation layer 320 that is far away from the substrate 100. Thereby, the complete structure of the pixel capacitor assembly 300 can be obtained.

In some embodiments, the passivation layer may also be extended to cover the first planarization layer 400, the source-drain electrode layer 250 and the inter-layer dielectric layer 240. As such, each layer/component of the TFT 200 (except the source electrode 251) can be configured to be sufficiently in contact with the second electrode 330.

In some embodiments, a third via 321 can be formed at a location of the passivation layer 320 corresponding to the first via 241 that is far away from the driving TFT. The third via 321 is configured to allow the electrical connection between the second electrode 330 and the source electrode 251.

The formation of the passivation layer 320 can be realized by depositing, yet there are no limitations to the specific approach.

Figure 15B:
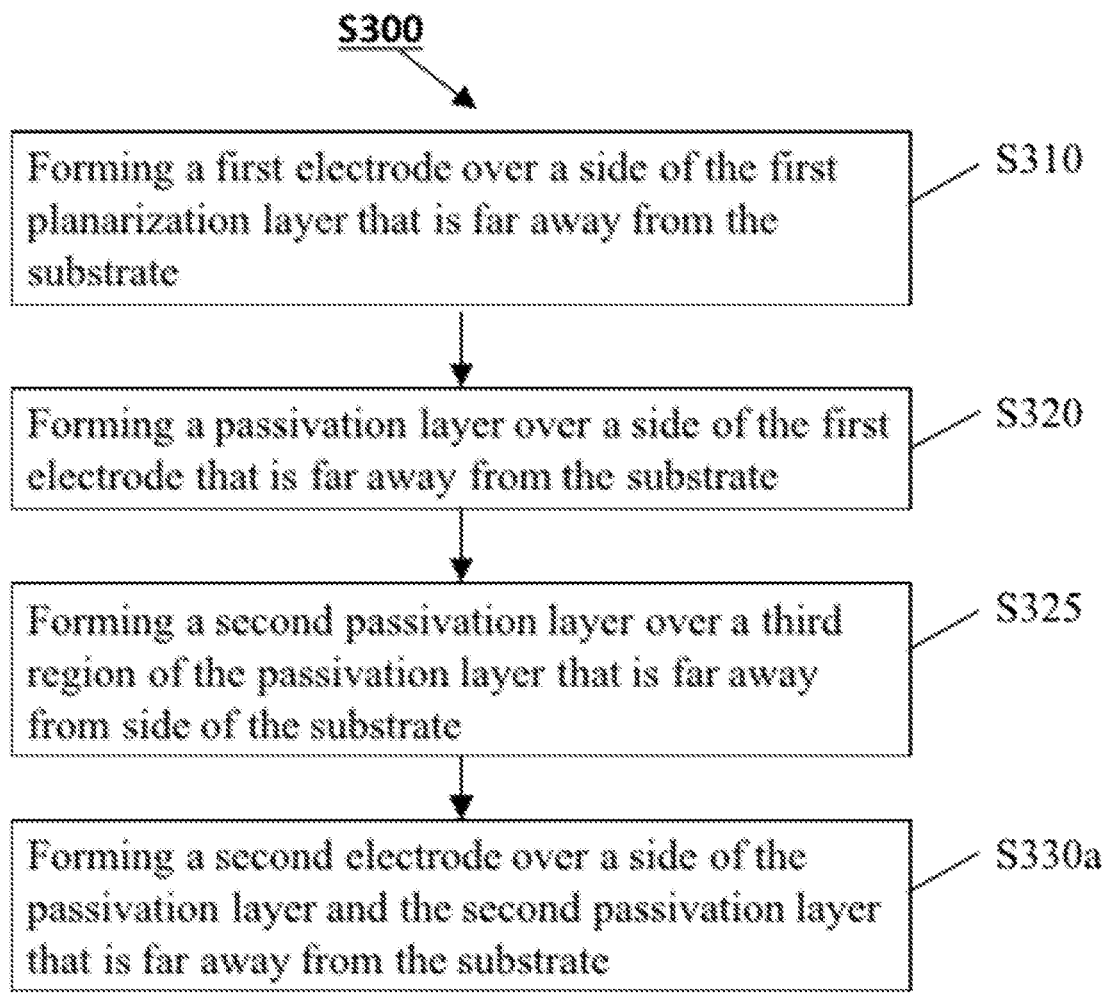
FIG. 15B is a flowchart of step S300 of the manufacturing method according to some other embodiments of the present disclosure.

In some embodiments, with reference to FIG. 15B, after step S320 and before step S330, the method may further comprise a sub-step:

S325: Forming a second passivation layer over a third region of the passivation layer that is far away from side of the substrate.

By means of this sub-step of the method, the second passivation layer 340 can be formed over a third region (i.e. region C in FIG. 4) of the passivation layer 320 that is far away from the substrate 100. The specific location of the third region (or region C) can refer to FIG. 4, and the description thereof is described above.

The formation of the second passivation layer 340 can be realized by depositing and patterning, yet there are no limitations to the specific approach.

Accordingly, the step S330 of forming a second electrode over a side of the passivation layer that is far away from the substrate can comprise:

S330a: Forming a second electrode over a side of the passivation layer and the second passivation layer that is far away from the substrate.

In some embodiments of the display backplane manufactured by the method disclosed herein, where the second electrode 330 is formed at the side of the passivation layer 320 and the second planarization layer 340 that is far away from the substrate 100, the second planarization layer 340 can increase the thickness of the region (i.e. region C) that is apart from the region where, where the orthographic projections of the second electrode 330 and the first electrode 310 do not overlap. As such, the charged second electrode 330 will not influence the thin film transistor 200.

In some specific example, the second electrode 330 can also be configured to be electrically connected to the source electrode 251 through a third via 321. As a result, the second electrode 330 can be at an electric potential of Vs.

The structure of the intermediate product obtained after this sub-step can refer to FIG. 18 and FIG. 3.

The sub-step S330 of forming the second electrode 330 can be realized by depositing and patterning, or by other approaches. There are no limitations herein.

It is noted that according to some embodiments of the display backplane, the first electrode 310 and the source-drain electrode 250 can be formed through a substantially same patterning process.

As such, in the manufacturing method for theses above embodiments of the display backplane, after the formation of the inter-layer dielectric layer 240 (i.e. sub-step S209) and before the formation of a source-drain electrode layer 250 (i.e. sub-step S210), there is a step of forming the first planarization layer 400 over the side of the inter-layer dielectric layer 240 that is far away from the substrate 100.

Following this step, another step of forming the first electrode 310 and the source-drain electrode 250 over a side of the inter-layer dielectric layer 240 and the first planarization layer 400 that is far away from the substrate 100 can be further carried out. In order to make sure that there is electrical connection between each of the source-drain electrode 250 to the conductive portion 212 of the active layer in the thin film transistor 200, before the step of forming the first electrode 310 and the source-drain electrode 250, a first via 241 can be formed to penetrate the inter-layer dielectric layer 240, and the subsequent step of forming the first electrode 310 and the source-drain electrode 250 can allow the proper electrical connection between each of the source-drain electrode 250 to the conductive portion 212 of the active layer in the thin film transistor 200.

These above embodiments of the manufacturing method have a simplified process, resulting in a reduced manufacturing cost.

In some embodiments, the manufacturing method further comprises, after the step S300:

S400: Forming an OLED component over a side the pixel capacitor assembly 300 that is far away from the substrate 100.

As such, an OLED display backplane with a relatively better structure and function can be obtained.

In some embodiments, the OLED component formed can be a top-emitting structure, and the second electrode 330 can be further configured as an anode of the OLED component. Consequently, the area of sub-pixels is smaller, which is beneficial for the improvement of the definition.

In other embodiments, the OLED component may be a bottom-emitting structure. The stacked pixel capacitor assembly 300 can shield the TFT 200 from lights, thereby the stability of the light of the display panel is improved, leading to a reduced difficulty for compensation.

In summary, the present disclosure provides a manufacturing method of a display backplane, where the area of sub-pixels occupied by the pixel capacitor assembly of this display backplane is smaller, which is beneficial for the improvement of the definition of the display panel.

In yet another aspect, the present disclosure further provides a display panel. The display panel comprises the aforementioned display backplane according to any one of the embodiments of the disclosure as described above.

There are no limitations to the specific type of the display panel. For example, it may be OLED display panel, but can also be of a different type.

It should be noted, in addition to the display backplane, the display panel may comprise other necessary structures and components. For example, in an OLED display panel, there may be a glass cover or an upper polarizer, and so on.

In yet another aspect, the present disclosure further provides a display device, which comprises the aforementioned display panel according to any one of the embodiments as described above.

Herein the display device can be an OLED display device, but can also be of a different type. There are no limitations herein.

In addition to the display panel, the display device can further comprise other necessary structures and components, such as a shell, a circuit board, power lines and so on.

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A display backplane, comprising:
a substrate;
a thin film transistor, over the substrate; and
a pixel capacitor assembly, over a side of the thin film transistor away from the substrate;
wherein when viewed from a vertical direction:
the pixel capacitor assembly overlaps with at least one portion of the thin film transistor;
wherein the pixel capacitor assembly comprises a first electrode, a passivation layer, and a second electrode, sequentially over a side of the thin film transistor away from the substrate, wherein:
the first electrode is overlapped with the thin film transistor when viewed from the vertical direction;
wherein the thin film transistor comprises an active layer having a conductive portion and a non-conductive portion, a gate insulating layer, a gate electrode, and an inter-layer dielectric layer, sequentially over the substrate, wherein:
the first electrode on the substrate is overlapped with the gate electrode and the non-conductive portion of the active layer when viewed from the vertical direction;
further comprising a first planarization layer, between the thin film transistor and the first electrode
wherein the thin film transistor further comprises a source-drain electrode layer over the active layer, wherein:
the first electrode and the source-drain electrode layer are both immediately under the passivation layer;
wherein the source-drain electrode layer comprises a source electrode, and the second electrode is electrically coupled to the source electrode;

wherein the second electrode on the substrate covers the active layer, the gate electrode, the source-drain electrode layer when viewed from the vertical direction;

wherein:

the passivation layer covers the first planarization layer, the source-drain electrode layer, and the inter-layer dielectric layer when viewed from the vertical direction; and the second electrode is electrically coupled to the source electrode through a via in the passivation layer.

2. The display backplane of claim 1, wherein the first electrode and the first planarization layer share a planar boundary.

3. The display backplane of claim 1, wherein the pixel capacitor assembly further comprises a second planarization layer, arranged between the passivation layer and a portion of the second electrode, wherein the portion of the second electrode is:

outside of a first region of the second electrode overlapping with the first electrode when viewed from the vertical direction; and outside of a second region of the second electrode electrically coupled with the source electrode of the source-drain electrode layer.

4. The display backplane of claim 1, wherein the passivation layer has a thickness of about 2500-3000 Å.

5. A display panel, comprising the display backplane according to claim 1.

6. The display panel of claim 5, further comprising an OLED component, arranged over a side of the pixel capacitor assembly away from the substrate.

7. The display panel of claim 6, wherein the OLED component is of a top-emitting type, wherein the second electrode is configured to serve as an anode of the OLED component.

8. A method for manufacturing a display backplane, comprising:

providing a substrate;

forming a thin film transistor over one side of the substrate; and forming a pixel capacitor assembly over a side of the thin film transistor away from the substrate and covering at least one portion of the thin film transistor when viewed from the vertical direction;

the method further comprising, between the forming a thin film transistor over one side of the substrate and the forming a pixel capacitor assembly over a side of the thin film transistor away from the substrate:

forming a first planarization layer over a side of the thin film transistor away from the substrate;

wherein the forming a pixel capacitor assembly over a side of the thin film transistor away from the substrate comprises:

forming a first electrode over a side of the first planarization layer away from the substrate;

forming a passivation layer over a side of the first electrode away from the substrate; and forming a second electrode over a side of the passivation layer away from the substrate, wherein the second electrode is electrically coupled to a source electrode of the thin film transistor;

wherein the forming a thin film transistor over one side of the substrate comprises:

forming a source-drain electrode layer over the substrate; wherein:

the forming a source-drain electrode layer over the substrate and the forming a first electrode over a side of the first planarization layer away from the substrate are substantially performed at a same step.

9. A method for manufacturing a display backplane, comprising:

providing a substrate;

forming a thin film transistor over one side of the substrate; and forming a pixel capacitor assembly over a side of the thin film transistor away from the substrate and covering at least one portion of the thin film transistor when viewed from the vertical direction;

the method further comprising, between the forming a thin film transistor over one side of the substrate and the forming a pixel capacitor assembly over a side of the thin film transistor away from the substrate:

forming a first planarization layer over a side of the thin film transistor away from the substrate;

wherein the forming a pixel capacitor assembly over a side of the thin film transistor away from the substrate comprises:

forming a first electrode over a side of the first planarization layer away from the substrate;

forming a passivation layer over a side of the first electrode away from the substrate; and forming a second electrode over a side of the passivation layer away from the substrate, wherein the second electrode is electrically coupled to a source electrode of the thin film transistor;

wherein the forming a pixel capacitor assembly over a side of the thin film transistor away from the substrate further comprises, after the forming a passivation layer over a side of the first electrode away from the substrate and prior to the forming a second electrode over a side of the passivation layer away from the substrate:

forming a second planarization layer over a side of the passivation layer away from the substrate, wherein the second planarization layer is arranged at a region not overlapping with the first electrode when viewed from the vertical direction, wherein the region is further outside an electrical coupling region between the second electrode and the source electrode.

* * * * *